United States Patent
Kanemaki et al.

(10) Patent No.: US 10,459,317 B2
(45) Date of Patent: *Oct. 29, 2019

(54) STRUCTURE, ELECTRONIC DEVICE INCLUDING THE SAME, AND METHOD OF MANUFACTURING STRUCTURE

(71) Applicant: KYOCERA CORPORATION, Kyoto (JP)

(72) Inventors: Yasuhito Kanemaki, Katano (JP); Akito Iwai, Osaka (JP); Kotaro Nakamura, Daito (JP); Shuhei Hisano, Machida (JP)

(73) Assignee: KYOCERA CORPORATION, Kyoto (JP)

( * ) Notice: Subject to any disclaimer, the term of this patent is extended or adjusted under 35 U.S.C. 154(b) by 140 days.

This patent is subject to a terminal disclaimer.

(21) Appl. No.: 15/660,755

(22) Filed: Jul. 26, 2017

(65) Prior Publication Data
US 2017/0322480 A1 Nov. 9, 2017

Related U.S. Application Data

(63) Continuation of application No. PCT/JP2016/051907, filed on Jan. 22, 2016.

(30) Foreign Application Priority Data

Jan. 27, 2015 (JP) ................................ 2015-013630

(51) Int. Cl.
*H01Q 1/24* (2006.01)
*G03B 17/08* (2006.01)
(Continued)

(52) U.S. Cl.
CPC ............ *G03B 17/08* (2013.01); *H01Q 1/243* (2013.01); *H01Q 1/38* (2013.01); *H01Q 9/42* (2013.01);
(Continued)

(58) Field of Classification Search
CPC .......... H01Q 1/243; H01Q 1/38; G03B 17/08; H04M 1/02; H04M 1/026; H04M 1/18; H05K 5/06; H05K 5/064; H05K 5/069
See application file for complete search history.

(56) References Cited

U.S. PATENT DOCUMENTS

| | | | |
|---|---|---|---|
| 10,225,943 B2* | 3/2019 | Kanemaki | H04M 1/02 |
| 2008/0001832 A1* | 1/2008 | Murakami | H01Q 1/243 |
| | | | 343/702 |

(Continued)

FOREIGN PATENT DOCUMENTS

| | | |
|---|---|---|
| JP | 2013239879 A | 11/2013 |
| JP | 2014003540 A | 1/2014 |

OTHER PUBLICATIONS

International Search Report/Written Opinion dated Apr. 5, 2016, in corresponding International Application No. PCT/JP2016/051908 with Concise Explanation in English.

(Continued)

*Primary Examiner* — Daniel Munoz
(74) *Attorney, Agent, or Firm* — Duane Morris LP

(57) ABSTRACT

A structure includes a sheet metal antenna as a first member, a rear-surface-side housing as a second member including a through hole, and a sealing portion which seals the through hole while the sealing portion fixes relative positional relation between the first and second members. The second member includes a space. The sheet metal antenna includes a second portion along a second surface and an intermediate portion which passes through the through hole and the like. The space includes a first region covered with the second portion and the like, a second region located opposite to the first region with the intermediate portion being interposed, and a third region which lies from one main surface of the intermediate portion to the other main surface thereof while (Continued)

it is in contact with both of the first region and the second region. The second portion includes an injection hole.

7 Claims, 11 Drawing Sheets

(51) Int. Cl.
*H01Q 1/38* (2006.01)
*H04M 1/02* (2006.01)
*H05K 5/06* (2006.01)
*H01Q 9/42* (2006.01)
*H04M 1/18* (2006.01)

(52) U.S. Cl.
CPC ............ *H04M 1/02* (2013.01); *H04M 1/026* (2013.01); *H04M 1/18* (2013.01); *H05K 5/06* (2013.01); *H05K 5/064* (2013.01); *H05K 5/069* (2013.01)

(56) References Cited

U.S. PATENT DOCUMENTS

2016/0036947 A1* 2/2016 Yamashita ............... H01Q 1/40
455/575.7
2017/0322480 A1 11/2017 Kanemaki et al.

OTHER PUBLICATIONS

International Search Report dated Apr. 5, 2016, in corresponding International Application No. PCT/JP2016/051907.

* cited by examiner

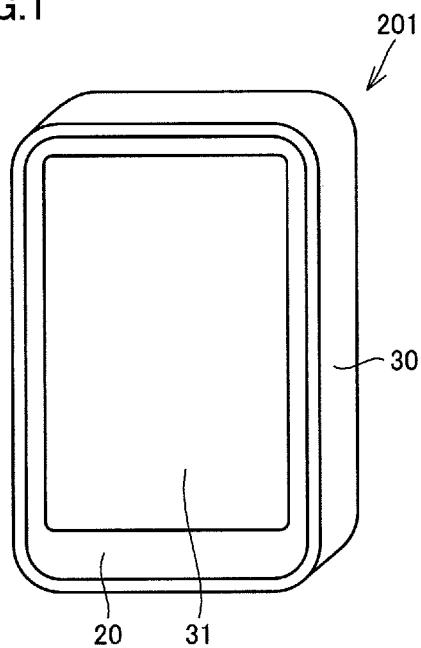
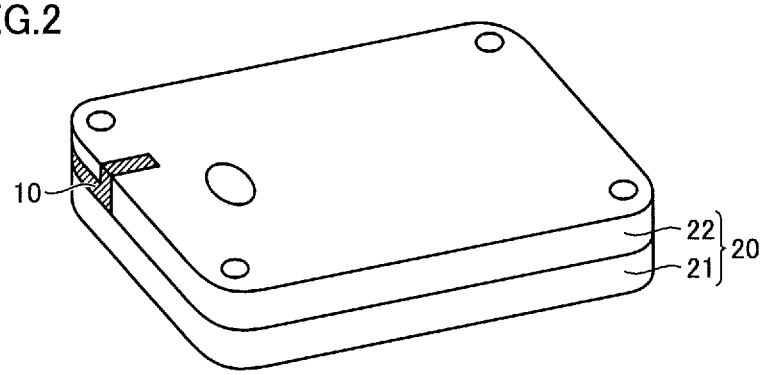

STRUCTURE, ELECTRONIC DEVICE INCLUDING THE SAME, AND METHOD OF MANUFACTURING STRUCTURE

CROSS-REFERENCE TO RELATED APPLICATION

The present application is a continuation based on PCT Application No. PCT/JP2016/051907 filed on Jan. 22, 2016, which claims the benefit of Japanese Application No. 2015-013630 filed on Jan. 27, 2015. PCT Application No. PCT/JP2016/051907 is entitled "Structure, Electronic Device Provided with Same, and Method for Producing Structure," and Japanese Application No. 2015-013630 is entitled "Composite Structure, Electronic Device Including the Same, and Method of Manufacturing Composite Structure." The contents of which are incorporated by reference herein in their entirety.

FIELD

An embodiment of the present disclosure relates to a structure, an electronic device including the same, and a method of manufacturing a structure.

BACKGROUND

Some electronic devices are required to be waterproof and to ensure communication performance through an antenna.

SUMMARY

A structure based on the present disclosure includes a first member, a second member including a first surface and a second surface which face opposite to each other and including a through hole which allows communication between a side of the first surface and a side of the second surface, and a sealing portion which seals the through hole while the sealing portion fixes relative positional relation between the first member and the second member, with the first member passing through the through hole. The second member includes a space which opens into the second surface adjacently to the through hole on the side of the second surface. The sealing portion includes a portion in the space in which a sealant is cured. The first member includes an extension portion which extends along the second surface on the side of the second surface of the second member and a pass-through portion which passes through the space and the through hole. The space includes a first region covered with the pass-through portion and the extension portion, a second region located opposite to the first region with the pass-through portion being interposed, and a third region which lies from one main surface of the pass-through portion to the other main surface of the pass-through portion while the third region is in contact with both of the first region and the second region. The extension portion includes a hole which exposes a part of the first region.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a first perspective view of an electronic device in a first embodiment.

FIG. 2 is a second perspective view of the electronic device in the first embodiment.

DETAILED DESCRIPTION (First Embodiment)

Figure 3:
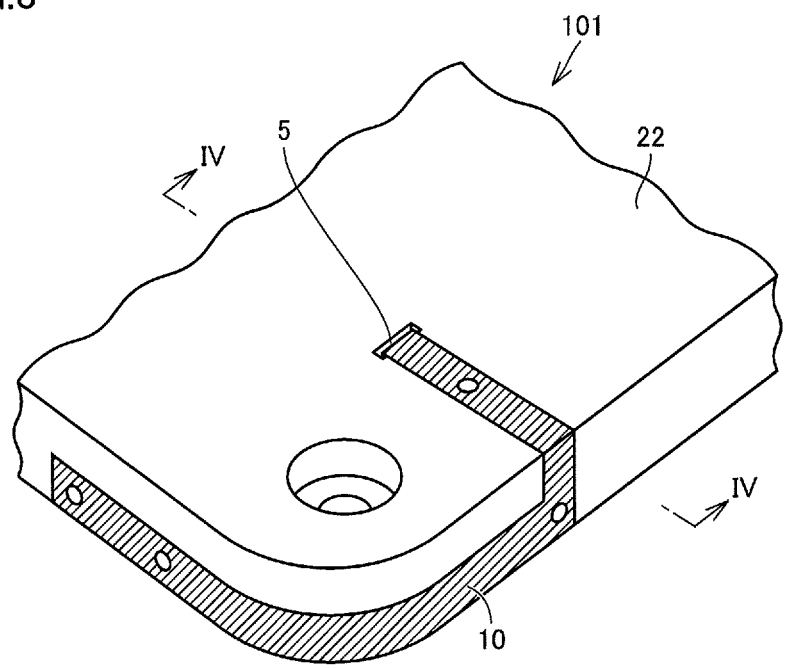
FIG. 3 is a partial perspective view of a structure in a second embodiment.

An electronic device in a first embodiment will be described with reference to FIGS. 1 to 3. An electronic device 201 in the first embodiment includes a structure. The "structure" here will be described in any of embodiments below. The structure will be described in detail in a second embodiment or later.

Though description of electronic device 201 is given here with a smartphone being defined as the electronic device, the electronic device is not limited to the smartphone. A construction shown in the first embodiment is applicable to a wide variety of electronic devices as will be described later.

In an example shown in FIG. 1, electronic device 201 includes a display 31 in a front surface. Electronic device 201 includes an exterior cover 30 so as to substantially cover a rear surface and side surfaces. In the example shown in FIG. 1, a housing 20 is seen in a portion of electronic device 201 not covered with exterior cover 30.

FIG. 2 shows a perspective view of a state that exterior cover 30 of electronic device 201 has been removed, with a side opposite to display 31, that is, a rear surface, facing upward. Housing 20 includes a front-surface-side housing 21 and a rear-surface-side housing 22. A sheet metal antenna 10 is located to cover a part of an outer surface of rear-surface-side housing 22. Sheet metal antenna 10 is hidden while exterior cover 30 is attached to housing 20.

Rear-surface-side housing 22 and sheet metal antenna 10 shown in FIG. 2 are some of components of the structure. The structure includes a first member and a second member. The first member includes sheet metal antenna 10. The second member includes rear-surface-side housing 22. FIG. 3 shows an enlarged view of a part of a portion corresponding to the structure, which is an extraction from the device shown in FIG. 2. FIG. 3 corresponds to an upper left portion in FIG. 2. FIG. 3 shows a view in a direction different from FIG. 2. Details of the structure are as set forth in the second embodiment or later.

Since the first embodiment includes the structure as described in embodiments which follow, a waterproof structure can readily be realized with a small number of parts. According to the first embodiment, a waterproof electronic device with a function to communicate through an antenna can be obtained. A structure for ensuring desired performance while achieving waterproofness can be realized with a small number of parts.

A shape of exterior cover 30 shown in FIG. 1 is merely by way of example and not limited thereto. A shape of exterior cover 30 may be varied as appropriate depending on a shape or arrangement of other parts. The electronic device in the first embodiment does not require exterior cover 30 and exterior cover 30 is optional.

Though rear-surface-side housing 22 corresponds to the second member in the first embodiment, front-surface-side housing 21 may correspond to the second member instead of rear-surface-side housing 22.

Though the term "electronic device" is used in the first embodiment, various devices are applicable as the electronic device. The electronic device may be, for example, a portable telephone, a portable information terminal, a tablet terminal, a personal computer, a game console, a television receiver, a portable music player, a CD player, a DVD player, an electronic dictionary, an electronic book reader, a digital camera, a video camera, a radio receiver, and a car navigation system. The concept of the portable telephone includes a smartphone.

(Second Embodiment)

Figure 4:
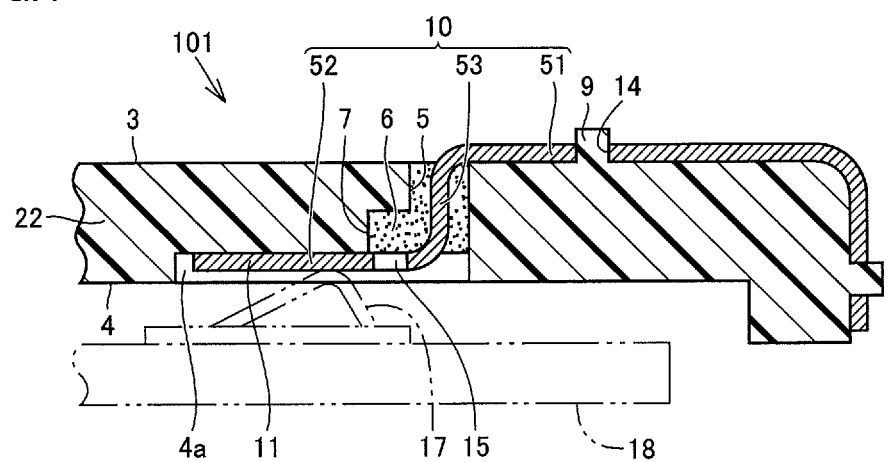
FIG. 4 is a cross-sectional view along the line IV-IV in FIG. 3.

A structure in the second embodiment will be described with reference to FIGS. 3 to 8. FIG. 4 is a cross-sectional view along the line IV-IV in FIG. 3.

The structure in the second embodiment includes an antenna structure. Though an antenna structure including a sheet metal antenna is described by way of example, the structure is not limited to that shown here.

A structure 101 in the second embodiment includes sheet metal antenna 10 as the first member, rear-surface-side housing 22 as the second member including a first surface 3 and a second surface 4 which face opposite to each other and including a through hole 5 which allows communication between a side of first surface 3 and a side of second surface 4, and a sealing portion 6 which seals through hole 5 while it fixes relative positional relation between sheet metal antenna 10 and rear-surface-side housing 22 with sheet metal antenna 10 passing through through hole 5. In rear-surface-side housing 22, first surface 3 is defined as an outer surface and second surface 4 is defined as an inner surface.

Rear-surface-side housing 22 includes a space 7 which opens into second surface 4 adjacently to through hole 5 on the side of second surface 4. Sealing portion 6 includes a portion in space 7 in which a sealant is cured. Sheet metal antenna 10 is in a form of a band. Sheet metal antenna 10 includes a first portion 51 which extends on the side of first surface 3, a second portion 52 as an extension portion which extends along second surface 4 on a side of second surface 4, and an intermediate portion 53 as a pass-through portion which is interposed between first portion 51 and second portion 52 and passes through space 7 and through hole 5. Second portion 52 includes an antenna terminal 11.

Figure 5:
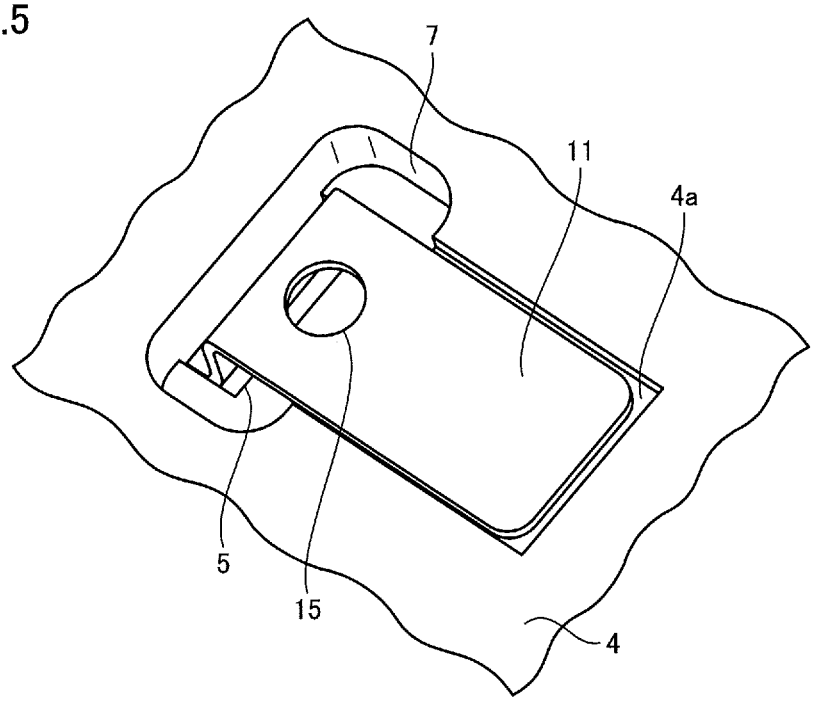
FIG. 5 is a perspective view of the structure in the second embodiment viewed from a side of a second surface.
Figure 6:
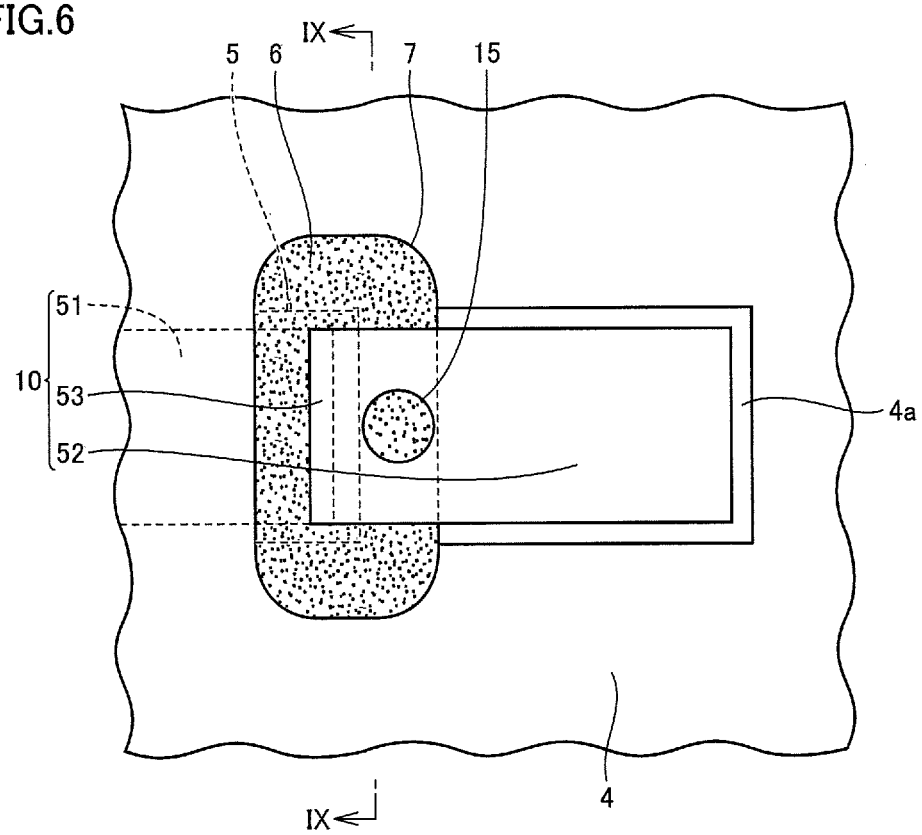
FIG. 6 is a plan view of the structure in the second embodiment viewed from the side of the second surface.
Figure 7:
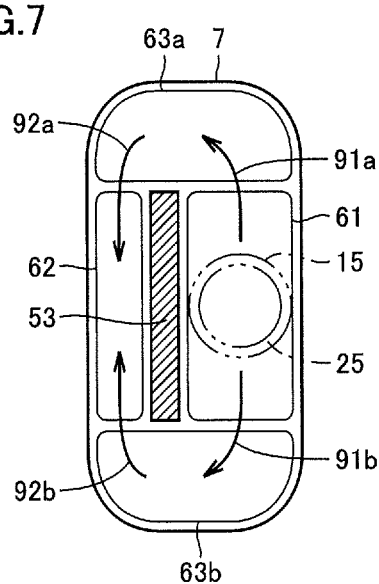
FIG. 7 illustrates an internal space in a space in the structure in the second embodiment.

FIG. 5 shows a perspective view of a portion in the vicinity of space 7 viewed from below in FIG. 4. FIG. 5 shows a state that sealing portion 6 has been removed for the sake of convenience of illustration. Space 7 may also be called a sealant chamber. FIG. 6 two-dimensionally shows space 7 filled with sealing portion 6. FIG. 7 shows details of an internal space in space 7.

As shown in FIG. 7, space 7 includes a first region 61 covered with intermediate portion 53 and second portion 52, a second region 62 located opposite to the first region with intermediate portion 53 being interposed, and a third region 63 which lies from one main surface of intermediate portion 53 to the other main surface thereof while it is in contact with both of first region 61 and second region 62. As shown in FIG. 7, there may be a plurality of third regions 63.

Second portion 52 of sheet metal antenna 10 includes an injection hole 15 as a hole which exposes a part of first region 61. Injection hole 15 is an opening for injecting a sealant into first region 61. For example, as shown in FIG. 7, the sealant injected into first region 61 through injection hole 15 by a nozzle 25 moves from first region 61 to third regions 63 as shown with arrows 91a and 91b, moves further to second region 62 as shown with arrows 92a and 92b, and finally collides with each other in second region 62. The sealant thus surrounds intermediate portion 53. Sealing portion 6 is formed as shown in FIG. 6 as the sealant is thus cured while the sealant surrounds intermediate portion 53 of sheet metal antenna 10.

As shown in FIG. 4, a recess 4a may be located in second surface 4 of rear-surface-side housing 22. Sheet metal antenna 10 includes antenna terminal 11 for electrical connection to other components. In the second embodiment, antenna terminal 11 is accommodated in recess 4a. As shown in FIG. 4, a fixing hole 14 may be located in sheet metal antenna 10. In the example shown in FIG. 4, fixing hole 14 is located in first portion 51 of sheet metal antenna 10. In this case, sheet metal antenna 10 is fixed to rear-surface-side housing 22 as a pin 9 on rear-surface-side housing 22 is inserted in fixing hole 14.

Figure 8:
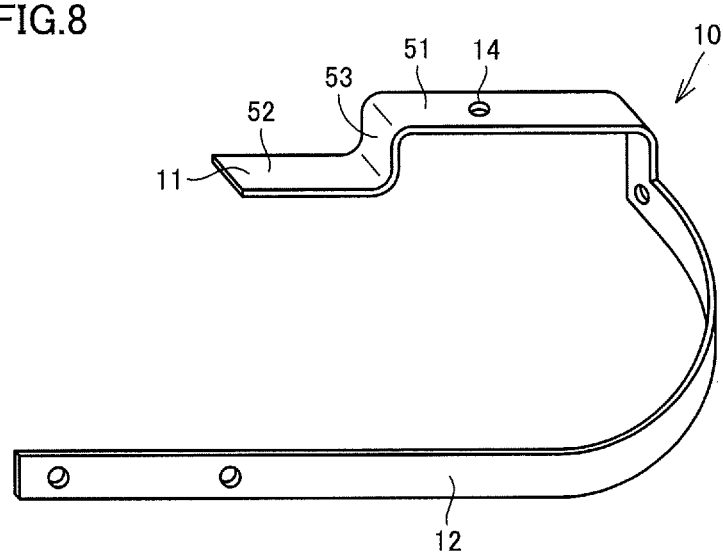
FIG. 8 is a perspective view of a sheet metal antenna as a first member included in the structure in the second embodiment.

FIG. 8 shows sheet metal antenna 10 as the first member extracted alone. Sheet metal antenna 10 is normally an integrally formed metal piece in a form of a band. Sheet metal antenna 10 includes first portion 51, second portion 52, and intermediate portion 53. A part or the entirety of second portion 52 serves as antenna terminal 11. Sheet metal antenna 10 includes an antenna main body 12 which extends on a side opposite to antenna terminal 11. Sheet metal antenna 10 is normally in such a structure as being bent midway. Sheet metal antenna 10 is exemplified merely by way of example of the first member, and the first member may be a member other than the sheet metal antenna. Even though the sheet metal antenna is employed as the first member, a shape or a size thereof is not limited to that shown here. What is shown in FIG. 8 is merely by way of example.

A spring contact terminal 17 placed on a wiring board 18 is relatively pressed against a surface of antenna terminal 11 as shown in FIG. 4, so that electrical connection is established. Though FIG. 4 shows wiring board 18 and spring contact terminal 17 with a chain double-dotted line, positions and shapes thereof are merely by way of example and not limited to those as illustrated.

Since the through hole through which the sheet metal antenna passes is sealed with the sealing portion in the second embodiment, passage of water between the outside and the inside of the housing can be prevented. Therefore, a waterproof structure of the housing can be realized while a state that performance of the sheet metal antenna can be exhibited is maintained. Since two parts of a nut with an O ring and a screw are not necessary in the second embodiment as compared with a method using a combination of a nut with an O ring and a screw, the number of parts can be reduced. A waterproof structure can readily be realized with a small number of parts. A structure for ensuring desired performance while achieving waterproofness can be realized with a small number of parts.

Sealing portion 6 may include a portion formed by filling with an adhesive. By adopting this feature, a sealing portion can readily be formed. Though the sealing portion may be formed by being partially filled with an adhesive, it may be formed by being totally filled with an adhesive. Some kind of resin may be employed for filling, instead of an adhesive.

In the second embodiment, since second portion 52 of sheet metal antenna 10 includes injection hole 15 which exposes a part of first region 61 of space 7, the sealant can accurately be injected into space 7 through injection hole 15. A state of injection of the sealant into space 7 can readily be stabilized. Characteristics of a finished product can thus be stabilized. When sheet metal antenna 10 is employed as the first member as exemplified here, antenna characteristics can be stabilized. Since injection hole 15 opens in a direction perpendicular to second surface 4, the sealant can also be injected in the direction perpendicular to second surface 4 by using injection hole 15. Therefore, an injection operation can also readily be automated by using a robot or the like. For example, when a structure corresponding to one electronic device includes a plurality of through holes 5 and each through hole 5 should be sealed, the robot can also be used to concurrently perform injection operations for the plurality of through holes 5.

First region 61 is a region in space 7 which is hidden and difficult to see. In the second embodiment, however, the sealant can directly be injected into such first region 61 through injection hole 15 so that the sealant can reliably be injected.

In the second embodiment, the sealant is injected through injection hole 15 into first region 61 and the sealant flows into second region 62 after first region 61. Even though the sealant overflows space 7, second region 62 where such overflow may take place is located opposite to first region 61, that is, opposite to a portion of electrical connection such as antenna terminal 11. Therefore, adverse influence on electrical connection by overflow with the sealant can be avoided as much as possible.

Figure 9:
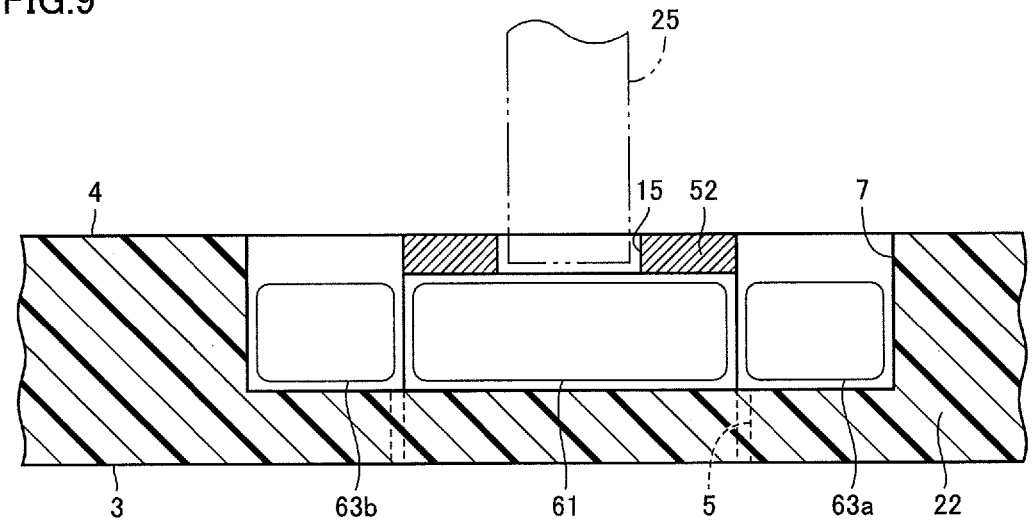
FIG. 9 is a cross-sectional view along the line IX-IX in FIG. 6.

FIG. 9 shows a cross-sectional view along the line IX-IX in FIG. 6. FIG. 9 shows a state that sealing portion 6 has been removed for the sake of convenience of illustration.

Figure 10:
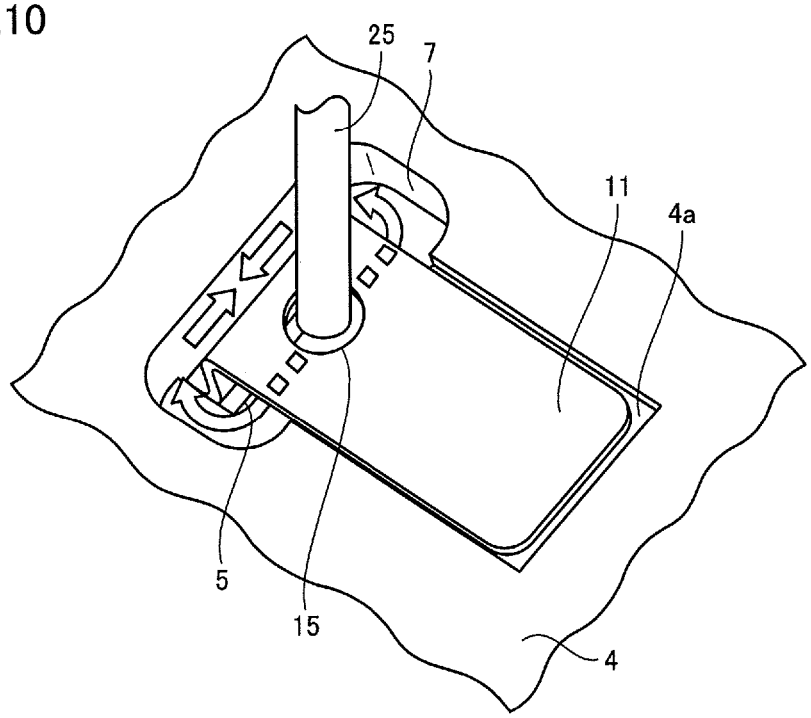
FIG. 10 illustrates injection of a sealant through a nozzle in order to obtain the structure in the second embodiment.

Injection hole 15 as a hole which exposes a part of first region 61 may be in a shape accepting a tip end of an instrument for injecting a sealant. The "instrument for injecting a sealant" includes, for example, a nozzle. The "instrument for injecting a sealant" may be, for example, a syringe. In the example shown in the second embodiment, injection hole 15 is a circular opening in the center in a width direction of rear-surface-side housing 22 defined as the second member. For example, when nozzle 25 with a cylindrical tip end is employed as an instrument for injecting a sealant, injection hole 15 should only be a circular opening slightly greater in diameter than the tip end of nozzle 25. Nozzle 25 can be positioned by inserting the tip end of nozzle 25 into injection hole 15. FIG. 9 shows nozzle 25 inserted in injection hole 15. FIG. 10 shows injection of a sealant through nozzle 25.

As shown in FIGS. 9 and 10, when viewed in a direction perpendicular to second surface 4, a portion in first region 61 which surrounds injection hole 15 may be covered with second portion 52. The sealant injected through injection hole 15 moves into space 7 while it moves in the direction substantially perpendicular to second surface 4. Here, the sealant may collide with a lower surface in space 7 and may rebound upward. When the portion surrounding injection hole 15 is covered with second portion 52 of sheet metal antenna 10 as the first member, however, the sealant which is injected and rebounds at the lower surface can be prevented from leaking from space 7.

As shown in FIGS. 5 to 7, when viewed in a direction perpendicular to second surface 4, third regions 63a and 63b may be rounded. With such a shape, a sealant injected into space 7 can smoothly move forward. The injected sealant should change its direction of movement when it goes around space 7, and in doing so, the sealant may change its direction with its strength of flow being lost as little as possible. Third regions 63a and 63b corresponding to a point of turn-back of the flow of the sealant may be rounded. The "rounded shape" here may refer to a shape rounded in a plan view but not rounded in a cross-section as shown here. Without being limited as such, the rounded shape may refer to a shape rounded, for example, both in a plan view and in a cross-section.

Though sheet metal antenna 10 has been described as the first member, the first member is not limited to the sheet metal antenna but may be another member. The first member may include the sheet metal antenna because benefits of a waterproof structure can particularly noticeably be received by applying the structure in the second embodiment to the sheet metal antenna of the electronic device and peripherals thereof.

The second member may include a housing because benefits of a waterproof structure can particularly noticeably be received by applying the structure described above to the housing of the electronic device and peripherals thereof.

A plurality of structures can also be constructed in one housing. One electronic device may include a plurality of structures. Here, a plurality of structures different in construction may together be present in one electronic device.

The electronic device in the first embodiment is an electronic device including any structure described in the second embodiment. Alternatively, the electronic device in the first embodiment may be an electronic device including a structure in any embodiment which will be described later. Since the electronic device in the first embodiment includes any structure described above, it can be an electronic device achieving desired performance with ensured waterproofness.

(Third Embodiment)

Figure 11:
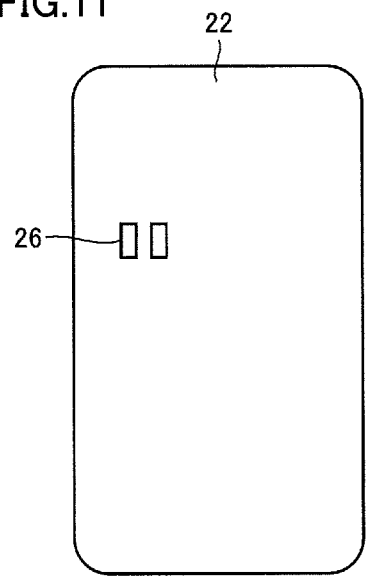
FIG. 11 is a plan view of a structure in a third embodiment.
Figure 12:
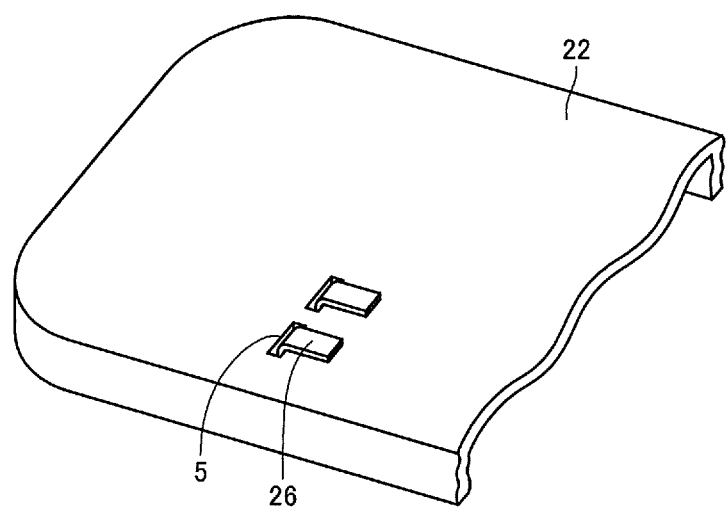
FIG. 12 is a partial perspective view of the structure in the third embodiment.

A structure in a third embodiment will be described with reference to FIGS. 11 and 12. In the third embodiment, a member other than the sheet metal antenna is employed as the first member. A power feed terminal 26 is employed as the first member as shown in FIGS. 11 and 12. Two power feed terminals 26 are located as one pair in one rear-surface-side housing 22. Individual power feed terminal 26 is a conductor in a form of a band. Power feed terminal 26 is located to pass through through hole 5 in rear-surface-side housing 22 as the second member. The structure as described in the second embodiment can be applied also to such power feed terminal 26.

As shown in the third embodiment, power feed terminal 26 may be employed as the first member and rear-surface-side housing 22 may be employed as the second member. The third embodiment is the same as the second embodiment in that first surface 3 is defined as the outer surface of the housing and second surface 4 is defined as the inner surface of the housing. A portion of power feed terminal 26 as the first member seen in FIGS. 11 and 12 corresponds to first portion 51 in the second embodiment.

In the third embodiment, a structure for ensuring performance for power feed while achieving waterproofness can be realized with a small number of parts.

(Fourth Embodiment)

Figure 13:
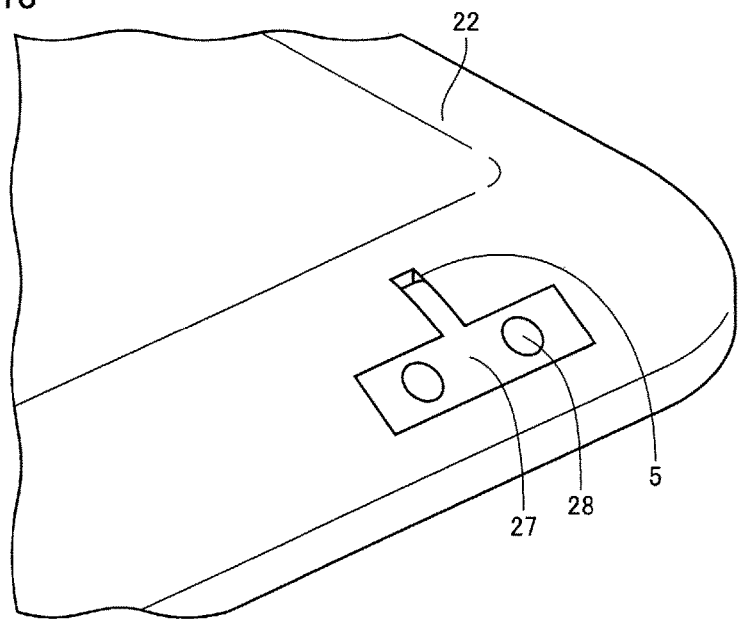
FIG. 13 is a partial perspective view of a structure in a fourth embodiment viewed from a first side.
Figure 14:
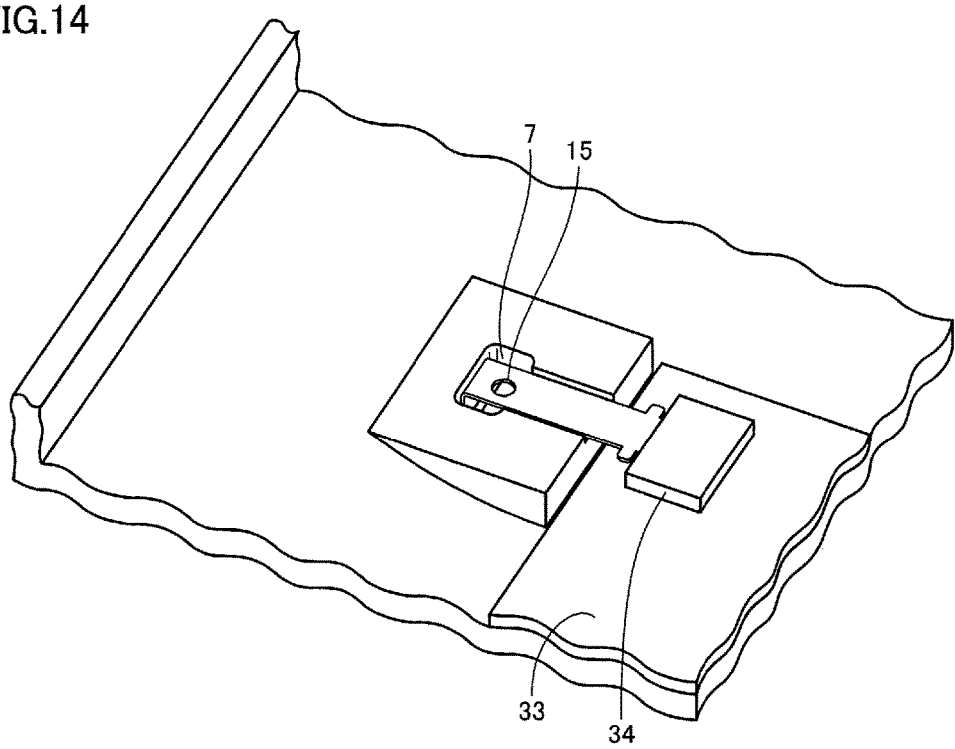
FIG. 14 is a partial perspective view of the structure in the fourth embodiment viewed from a second side.

A structure in a fourth embodiment will be described with reference to FIGS. 13 and 14. In the fourth embodiment, a flexible substrate (FPC) 27 is employed as the first member as shown in FIGS. 13 and 14. In the example shown in FIG. 13, flexible substrate 27 is what is called a key FPC and includes two keys 28. Flexible substrate 27 is located to pass through through hole 5 in rear-surface-side housing 22 as the second member. FIG. 14 shows rear-surface-side housing 22 viewed from a rear side. A substrate 33 is located and a connector 34 is located on a surface of substrate 33. One end of flexible substrate 27 which passes through through hole 5 is connected to connector 34 through space 7. Though the sealing portion in space 7 is not shown for the sake of convenience of illustration in the example shown in FIG. 14, actually, space 7 is filled with a sealant and the sealant is cured to serve as the sealing portion. The structure as described in the second embodiment can be applied also to such flexible substrate 27.

In the fourth embodiment, flexible substrate 27 may be employed as the first member and rear-surface-side housing 22 may be employed as the second member. The fourth embodiment is the same as the second embodiment in that first surface 3 is defined as the outer surface of the housing and second surface 4 is defined as the inner surface of the housing. A portion of flexible substrate 27 as the first member seen in FIG. 13 corresponds to first portion 51 in the second embodiment. A portion of flexible substrate 27 as the first member seen in FIG. 14 corresponds to second portion 52 in the second embodiment.

Though an example in which flexible substrate 27 is a key FPC has been shown here, the structure can similarly be applied also to a flexible substrate of another type.

In the fourth embodiment, a structure for ensuring performance for installation of keys while achieving waterproofness can be realized with a small number of parts.

In the fourth embodiment, front-surface-side housing 21 may be employed as the second member, instead of rear-surface-side housing 22.

(Fifth Embodiment)

Figure 15:
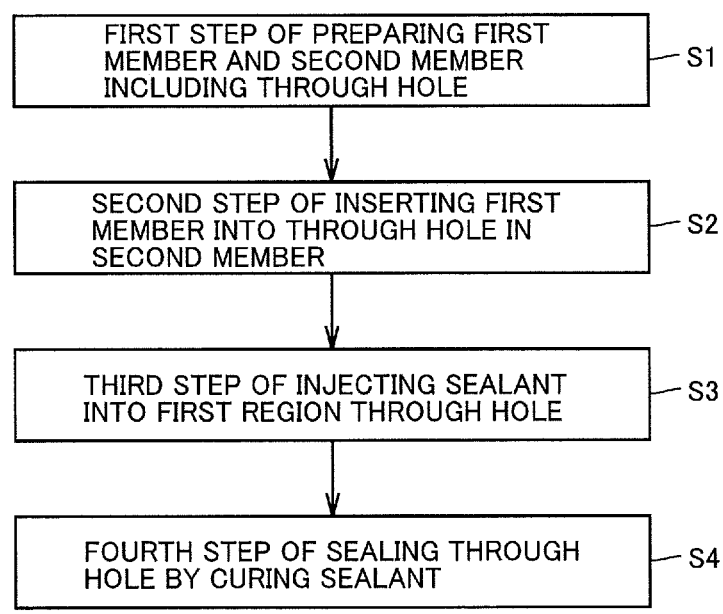
FIG. 15 is a flowchart of a method of manufacturing a structure in a fifth embodiment.
Figure 16:
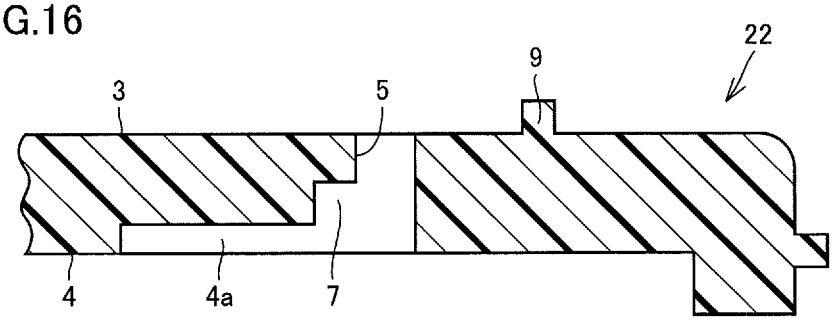
FIG. 16 is a cross-sectional view of a rear-surface-side housing as a second member prepared in a first step of the method of manufacturing a structure in the fifth embodiment.
Figure 17:
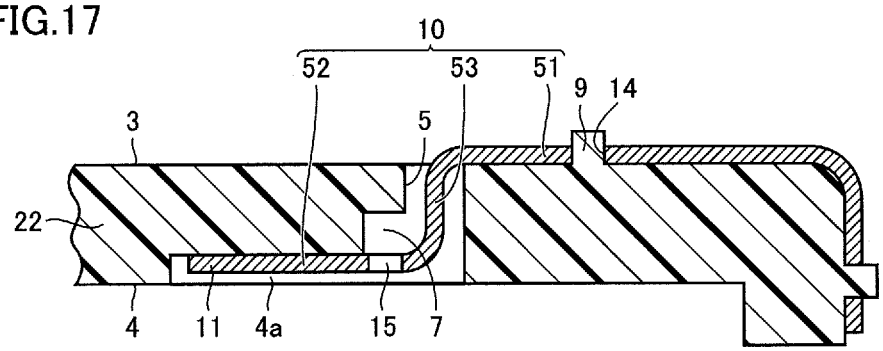
FIG. 17 is a cross-sectional view of a structure after a second step in the method of manufacturing a structure in the fifth embodiment is performed.

A method of manufacturing a structure in a fifth embodiment will be described with reference to FIGS. 15 to 17. FIG. 15 shows a flowchart of the method of manufacturing a structure in the fifth embodiment. A method of manufacturing the structure described in the second embodiment will be described here by way of example.

The method of manufacturing a structure in the fifth embodiment includes a first step S1 of preparing a first member and a second member, the second member including a first surface and a second surface which face opposite to each other and including a through hole which allows communication between a side of the first surface and a side of the second surface, a second step S2 of inserting the first member in the through hole, a third step S3 of injecting a sealant into a portion including the through hole after second step S2, and a fourth step S4 of sealing the through hole while the first member and the second member are fixed relatively to each other by curing the sealant injected in third step S3. The second member includes a space which opens into the second surface adjacently to the through hole on the side of the second surface. The first member includes an extension portion which extends along the second surface on the side of the second surface of the second member and a pass-through portion which passes through the space and the through hole. The space includes a first region surrounded by the pass-through portion and the extension portion, a second region located opposite to the first region with the pass-through portion being interposed, and a third region which lies from one main surface of the pass-through portion to the other main surface of the pass-through portion while the third region is in contact with both of the first region and the second region. The extension portion includes a hole which exposes a part of the first region. In third step S3, the sealant is injected into the first region through the hole by applying a tip end of an instrument for injecting the sealant to the hole. In third step S3, the sealant injected into the first region is located to surround the pass-through portion as the sealant moves to the third region via the second region.

Each step will specifically be described. In first step S1, for example, sheet metal antenna 10 as the first member as shown in FIG. 8 and rear-surface-side housing 22 as the second member as shown in FIG. 16 are prepared.

In second step S2, sheet metal antenna 10 as the first member is inserted in through hole 5 in the second member. Consequently, a structure as shown in FIG. 17 is obtained. Injection hole 15 as a hole which exposes a part of first region 61 is located in advance in second portion 52 of sheet metal antenna 10.

Third step S3 performed subsequently to the above is as shown in FIGS. 7, 9, and 10. A sealant is injected into a portion including the through hole, that is, the space. Injection can be carried out, for example, by using nozzle 25. The sealant is injected into first region 61 through injection hole 15, for example, by applying the tip end of nozzle 25 to injection hole 15 in the first member.

Third step S3 performed subsequently to the above is as shown in FIGS. 7, 9, and 10. A sealant is injected into a portion including the through hole. The "portion including the through hole" here refers, for example, to a portion which is combination of through hole 5 and space 7. Injection can be carried out, for example, by using nozzle 25. The sealant is injected into first region 61 through injection hole 15, for example, by applying the tip end of nozzle 25 to injection hole 15 in second portion 52 of the first member.

In fourth step S4, through hole 5 is sealed while the first member and the second member are fixed relatively to each other by curing the sealant injected in third step S3. Third step S3 and fourth step S4 may be performed concurrently.

According to the method of manufacturing a structure in the fifth embodiment, a structure allowing realization of a structure for ensuring desired performance while achieving waterproofness with a small number of parts can be obtained. In the fifth embodiment, since the sealant is injected into first region 61 through injection hole 15 by using the first member including injection hole 15 for injecting a sealant into first region 61 and applying the tip end of the instrument for injecting the sealant to injection hole 15 in third step S3, the sealant can accurately be injected. A state of injection of the sealant can readily be stabilized.

(Sixth Embodiment)

Figure 18:
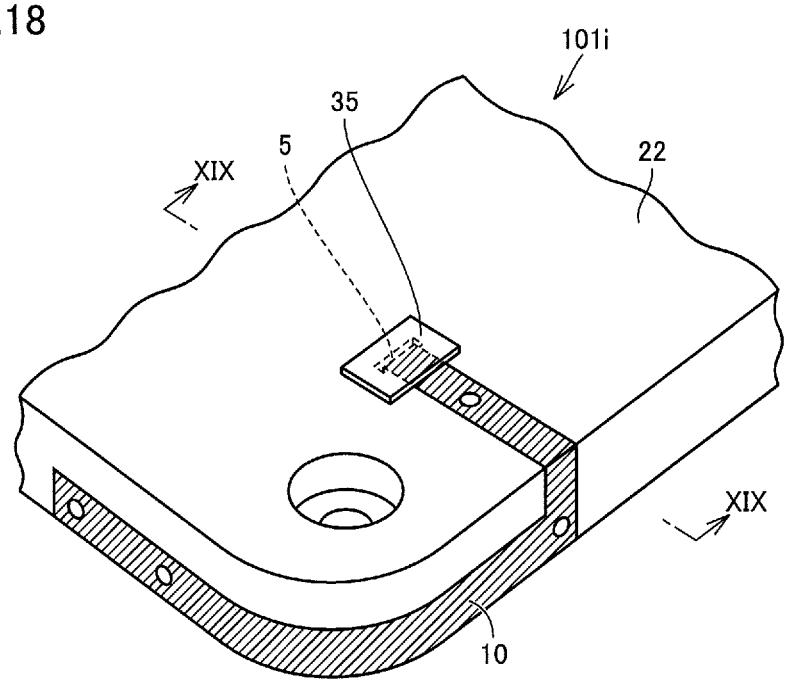
FIG. 18 is a partial perspective view of a structure in a sixth embodiment.
Figure 19:
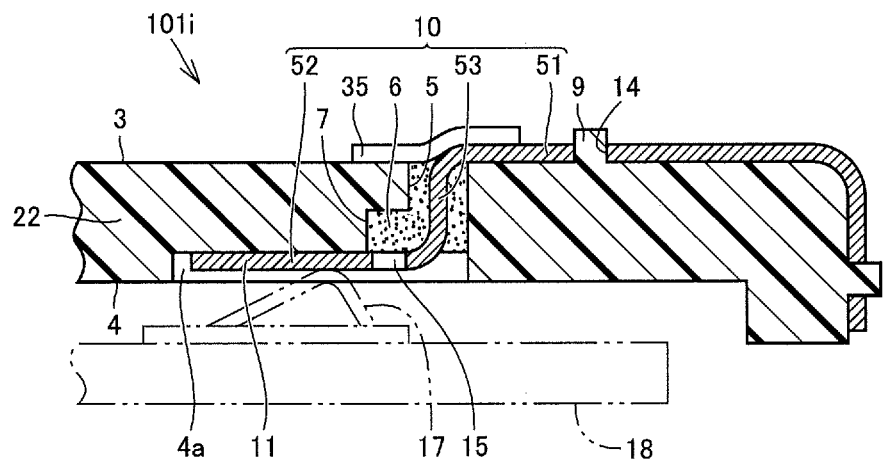
FIG. 19 is a cross-sectional view along the line XIX-XIX in FIG. 18.

A structure in a sixth embodiment will be described with reference to FIGS. 18 to 19. FIG. 18 shows a structure 101i in the sixth embodiment. FIG. 19 shows a cross-sectional view along the line XIX-XIX in FIG. 18. Structure 101i is similar in basic construction to that described in the second embodiment, however, it is different from the second embodiment in the following.

In structure 101i, a sheet 35 is stuck to close through hole 5. Sheet 35 is stuck to lie across outer surface 3 of rear-surface-side housing 22 and a surface of sheet metal antenna 10. Sheet 35 may be stuck, for example, by adhesion. A material for sheet 35 is not particularly limited and the sheet may be composed, for example, of polycarbonate. Sheet 35 has a thickness, for example, of 0.15 mm.

In assembling structure 101i, for example, sheet metal antenna 10 is inserted in through hole 5 in rear-surface-side housing 22, thereafter sheet 35 is stuck to close an outer end of through hole 5, and a surface to which sheet 35 is stuck is set to face down in this state. Then, a sealant should only be injected through injection hole 15 in second portion 52 which opens upward.

An effect the same as in the second embodiment can be achieved also in the sixth embodiment. Since sheet 35 serves as the bottom and prevents displacement or drop of the sealant downward under the gravity in the sixth embodiment, the sealant before curing is more likely to remain in through hole 5 and space 7. Solidification of the sealant with the sealant being located at an appropriate position is facilitated. After the sealant is solidified, sealing portion 6 is hidden by sheet 35 when rear-surface-side housing 22 is viewed from the outer side, that is, from above in FIG. 19. Therefore, a user can be prevented from touching sealing portion 6. Sheet 35 serves to protect sealing portion 6.

(Seventh Embodiment)

Figure 20:
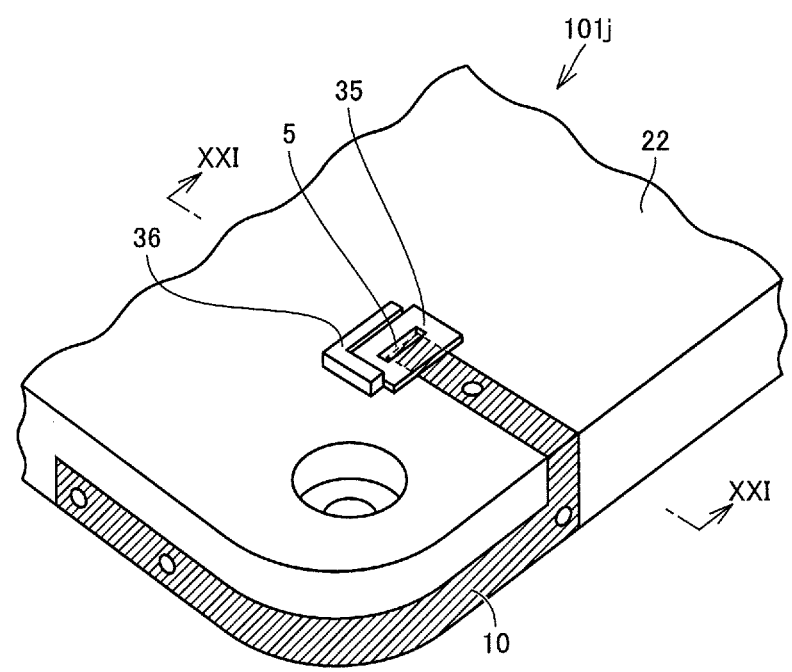
FIG. 20 is a partial perspective view of a structure in a seventh embodiment.
Figure 21:
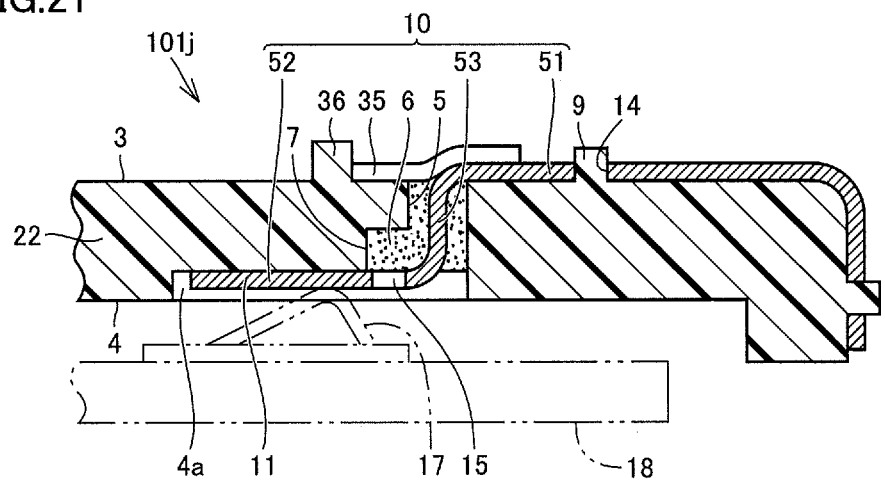
FIG. 21 is a cross-sectional view along the line XXI-XXI in FIG. 20.

A structure in a seventh embodiment will be described with reference to FIGS. 20 to 21. FIG. 20 shows a structure 101j in the seventh embodiment. FIG. 21 shows a cross-sectional view along the line XXI-XXI in FIG. 20. Structure 101j is similar in basic construction to that described in the sixth embodiment, however, it is different from the sixth embodiment in the following.

In structure 101j, a projection portion 36 for positioning of sheet 35 is located in the vicinity of through hole 5. In the example shown in FIGS. 20 and 21, projection portion 36 is formed from a protrusion like a wall and it is in an L-shape when viewed two-dimensionally. In sticking sheet 35, sheet 35 is positioned by laterally pressing an end of sheet 35 against projection portion 36. Projection portion 36 is a part of rear-surface-side housing 22. Projection portion 36 may be formed integrally with other portions of rear-surface-side housing 22. Though an example in which projection portion 36 is in an L-shape has been shown here, the projection portion is not necessarily in an L-shape. Projection portion 36 is not limited to a projection portion in a shape of one continuous L, but two sides perpendicular to each other may be disposed at an interval from each other. Projection portion 36 may be formed, for example, from a plurality of protrusions in a form of pins. Sheet 35 may be positioned by laterally pressing sheet 35 against these protrusions in a form of pins.

(Eighth Embodiment)

Figure 22:
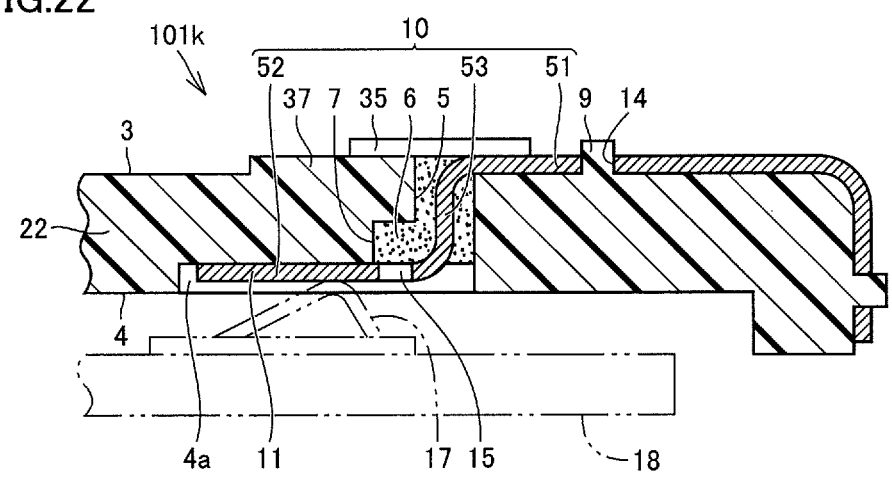
FIG. 22 is a cross-sectional view of a structure in an eighth embodiment.

A structure in an eighth embodiment will be described with reference to FIG. 22. FIG. 22 shows a structure 101k in the eighth embodiment. Structure 101k is similar in basic construction to that described in the sixth embodiment, however, it is different from the sixth embodiment in the following.

Though a height difference has been located midway in sheet 35 in the example shown in FIGS. 19 and 21, such a height difference does not have to be located. In structure 101k in the eighth embodiment, as shown in FIG. 22, a shored-up portion 37 is located in a part in the vicinity of through hole 5 in upper surface 3 of rear-surface-side housing 22. Shored-up portion 37 refers to a portion increased in height like a platform. An upper surface of shored-up portion 37 is flat. In the example shown in FIG. 22, a height of shored-up portion 37 is substantially the same as a thickness of sheet metal antenna 10. By adopting this construction, sheet 35 can be stuck while sheet 35 is not substantially bent but maintains a flat state. Since load applied to sheet 35 can be lower by sticking the sheet in such a flat state, reliability of sheet 35 increases. Shored-up portion 37 should only be located in a region around through hole 5 where sheet 35 is layered. Though projection portion 36 is not shown in the example shown in FIG. 22, projection portion 36 and shored-up portion 37 may both be employed. For example, on an upper surface of shored-up portion 37, a projection portion 36 for positioning may be located to further protrude.

Some of embodiments may be adopted as being combined as appropriate.

Though embodiments of the present disclosure have been described, it should be understood that embodiments disclosed herein are illustrative and non-restrictive in every respect. The scope of the present disclosure is defined by the terms of the claims and is intended to include any modifications within the scope and meaning equivalent to the terms of the claims.

The invention claimed is:

1. A structure comprising:
   a first member;
   a second member including a first surface and a second surface which face opposite to each other and including a through hole which allows communication between a side of the first surface and a side of the second surface; and
   a sealing portion which seals the through hole while the sealing portion fixes relative positional relation between the first member and the second member, with the first member passing through the through hole,
   the second member including a space which opens into the second surface adjacently to the through hole on the side of the second surface,
   the first member including
      an extension portion which extends along the second surface on the side of the second surface of the second member, and
      a pass-through portion which passes through the space and the through hole, the space including
         a first region covered with the pass-through portion and the extension portion,
         a second region located opposite to the first region with the pass-through portion being interposed, and a third region which lies from one main surface of the pass-through portion to the other main surface of the pass-through portion while the third region is in contact with both of the first region and the second region, and the extension portion including a hole which exposes a part of the first region.

2. The structure according to claim 1, wherein the sealing portion includes a sealant in the space and the hole is in a shape for accepting a tip end of an instrument for injecting the sealant.

3. The structure according to claim 1, wherein a portion in the first region which surrounds the hole is covered with the extension portion when viewed in a direction perpendicular to the second surface.

4. The structure according to claim 1, wherein the third region is in a rounded shape when viewed in a direction perpendicular to the second surface.

5. The structure according to claim 1, wherein the first member includes a sheet metal antenna.

6. The structure according to claim 1, wherein the second member includes a housing.

7. An electronic device comprising the structure according to claim 1.

* * * * *